United States Patent
Fogato

(10) Patent No.: US 10,490,726 B2
(45) Date of Patent: Nov. 26, 2019

(54) PYROELECTRIC GENERATOR

(71) Applicant: SICPA HOLDING SA, Prilly (CH)

(72) Inventor: Corrado Fogato, Ivrea (IT)

(73) Assignee: SICPA HOLDING SA, Prilly (CH)

(*) Notice: Subject to any disclaimer, the term of this patent is extended or adjusted under 35 U.S.C. 154(b) by 98 days.

(21) Appl. No.: 15/510,549

(22) PCT Filed: Jul. 30, 2015

(86) PCT No.: PCT/EP2015/067577
§ 371 (c)(1),
(2) Date: Mar. 10, 2017

(87) PCT Pub. No.: WO2016/037762
PCT Pub. Date: Mar. 17, 2016

(65) Prior Publication Data
US 2017/0263840 A1    Sep. 14, 2017

(30) Foreign Application Priority Data

Sep. 11, 2014  (EP) ..................... 14184401

(51) Int. Cl.
*H01L 37/02*  (2006.01)
*H01G 4/12*  (2006.01)
(Continued)

(52) U.S. Cl.
CPC ............ *H01L 37/025* (2013.01); *G01K 7/003* (2013.01); *G01K 7/34* (2013.01); *H01G 4/008* (2013.01);
(Continued)

(58) Field of Classification Search
CPC ....... H01L 37/02; H01L 27/16; H01L 41/083; H01L 41/257; G01J 5/34; G01J 5/0853;
(Continued)

(56) References Cited

U.S. PATENT DOCUMENTS 3,359,470 A * 12/1967 Ohno ................. C04B 35/46
                                                       29/25.35
4,425,540 A *  1/1984 Olsen ................. H01L 37/02
                                                       310/306
(Continued)

FOREIGN PATENT DOCUMENTS

CN    104716255    6/2015
DE    19753769     6/1999
(Continued)

OTHER PUBLICATIONS

J. Xie, X. P. Mane, C. W. Green, K. M. Mossi, K. K. Leang, "Performance of Thin Piezoelectric Materials for Pyroelectric Energy Harvesting", Journal of Intelligent Material Systems and Structures, Feb. 2010, vol. 21, No. 3, pp. 243-249.
(Continued)

*Primary Examiner* — Gail Kaplan Verbitsky
(74) *Attorney, Agent, or Firm* — Muncy, Geissler, Olds & Lowe, P.C.

(57) ABSTRACT

A pyroelectric device, comprising a plurality of layers of a polar dielectric material having a pyroelectric coefficient, p, wherein each layer exhibits pyroelectric properties; a plurality of conductive electrodes, wherein each conductive electrode is substantially in contact with at least a portion of one surface of a respective at least one of said plurality of layers of polar dielectric material, wherein said electrodes are electrically connected in a parallel configuration as to form a series of capacitors comprised of said plurality of layers of polar dielectric material and plurality of conductive electrodes.

17 Claims, 17 Drawing Sheets

(51) Int. Cl.
  *G01K 7/00* (2006.01)
  *H01L 21/28* (2006.01)
  *H01L 41/257* (2013.01)
  *G01K 7/34* (2006.01)
  *H01G 4/008* (2006.01)
  *H01G 4/012* (2006.01)
  *H01G 4/30* (2006.01)
  *H01G 4/38* (2006.01)

(52) U.S. Cl.
  CPC ........... *H01G 4/012* (2013.01); *H01G 4/1227* (2013.01); *H01G 4/30* (2013.01); *H01G 4/38* (2013.01); *H01L 29/40111* (2019.08); *H01L 41/257* (2013.01)

(58) Field of Classification Search
  CPC ........... G01J 1/46; G08B 13/191; G01K 7/34; G01K 7/003
  USPC .................................................. 307/109, 110
  See application file for complete search history.

(56) References Cited

U.S. PATENT DOCUMENTS

| | | | | |
|---|---|---|---|---|
| 4,647,836 A * | 3/1987 | Olsen | ...................... | H01L 37/02 310/308 |
| 5,032,471 A * | 7/1991 | Sakata | .................. | C04B 35/493 428/699 |
| 5,266,651 A * | 11/1993 | Foss | ...................... | C07C 317/32 525/276 |
| 5,644,184 A * | 7/1997 | Kucherov | ............... | F25B 21/00 310/306 |
| 6,049,080 A * | 4/2000 | Ito | ............................ | G01J 5/02 250/338.3 |
| 6,121,615 A * | 9/2000 | Ito | ............................ | G01J 5/34 250/338.3 |
| 7,391,938 B2 * | 6/2008 | Peyghambarian | ...... | G02F 1/065 385/122 |
| 7,518,470 B2 * | 4/2009 | Makibuchi | ........... | H03H 9/0038 333/133 |
| 7,732,770 B2 * | 6/2010 | Han | ......................... | G01J 5/02 250/338.3 |
| 8,221,713 B2 * | 7/2012 | Li | ............................ | B82Y 30/00 423/263 |
| 8,565,569 B2 * | 10/2013 | Jen | ......................... | B82Y 20/00 385/129 |
| 9,798,071 B1 * | 10/2017 | Scripsick | ............... | H01L 37/02 |
| 10,139,288 B2 * | 11/2018 | Ghosh | ..................... | G01K 7/38 |
| 2006/0163482 A1 * | 7/2006 | Mantese | ................... | G01J 5/34 250/338.2 |
| 2007/0297708 A1 * | 12/2007 | Peyghambarian | ...... | G02F 1/065 385/2 |
| 2008/0315100 A1 * | 12/2008 | Han | ......................... | G01J 5/02 250/338.3 |
| 2009/0141427 A1 | 6/2009 | Lyoo et al. | | |
| 2010/0011768 A1 * | 1/2010 | Hacsi | ....................... | F03G 7/00 60/721 |
| 2011/0315181 A1 * | 12/2011 | Erbil | ...................... | H01L 37/02 136/201 |
| 2012/0056504 A1 * | 3/2012 | Hunter | .................... | H01L 37/02 310/306 |
| 2013/0074900 A1 * | 3/2013 | Epstein | .................. | F25B 21/00 136/207 |
| 2013/0099121 A1 | 4/2013 | Kawano et al. | | |
| 2013/0105693 A1 * | 5/2013 | Noda | ...................... | G01J 5/046 250/338.3 |
| 2016/0284975 A1 * | 9/2016 | Horikiri | ............. | H01L 41/0805 |

FOREIGN PATENT DOCUMENTS

| | | |
|---|---|---|
| JP | 410209388 A * | 8/1998 |
| RU | 2088558 C1 * | 8/1997 |
| WO | 1997001868 | 1/1997 |
| WO | 1998054737 | 12/1998 |
| WO | 2009066100 | 5/2009 |

OTHER PUBLICATIONS

A. Cuadras, M. Gasulla, V. Ferrari, "Thermal Energy Harvesting through Pyroelectricity", Sensors and Actuators A: Physical, vol. 128(1) Mar. 2010, pp. 132-139.
A. K. Batra, A. Bandyopadhyay, A. K. Chilvery, M. Thomas, "Modeling and simulation for PVDF-based Pyroelectric Energy Harvester", Energy Science and Technology, vol. 5, No. 2, 2013, pp. 1-7.
International Search Report and Written Opinion issued with respect to application No. PCT/EP2015/067577.
Chinese Office Action and Search Report issued in counterpart Chinese Application No. 201580049005.6 dated Nov. 5, 2018 (and English language translation of the Office Action).
Piezoelectric Ferroelectric Physics, Shandong University, ed., "Piezoelectric Ceramics and Their Applications", Shandong Peoplechar(39)s Publishing House, 1974 (pp. 149-154) (and English language translation of the relevant portion).
Chinese Office Action in counterpart Chinese Application No. 201580049005.6 dated Jul. 19, 2019 (and English language translation of the Office Action).

* cited by examiner

| EIA INCH CODE | DIMENSIONS L X W (mm X mm) | AREA (mm²) |
| --- | --- | --- |
| 0402 | 1 X 0.5 | 1.5 |
| 0603 | 1.6 X 0.8 | 1.28 |
| 0805 | 2 X 1.25 | 2.5 |
| 1206 | 3.2 X 1.6 | 5.12 |
| 1210 | 3.2 X 2.5 | 8 |
| 1410 | 3.6 X 2.5 | 9 |
| 1515 | 3.81 X 3.81 | 14.5 |

PLOT OF (a) PAVEMENT TEMPERATURE AT HUNTSVILLE (ALABAMA, USA) AND RESPECTIVE (b) GENERATED VOLTAGE AND (c) ENERGY

PLOT OF (a) ENVIRONMENT TEMPERATURE AT SAUDI ARABIA AND RESPECTIVE (b) GENERATED VOLTAGE AND (c) ENERGY

PLOT OF (a) ENVIRONMENT TEMPERATURE AT PLANET MARS AND RESPECTIVE (b) GENERATED VOLTAGE AND (c) ENERGY

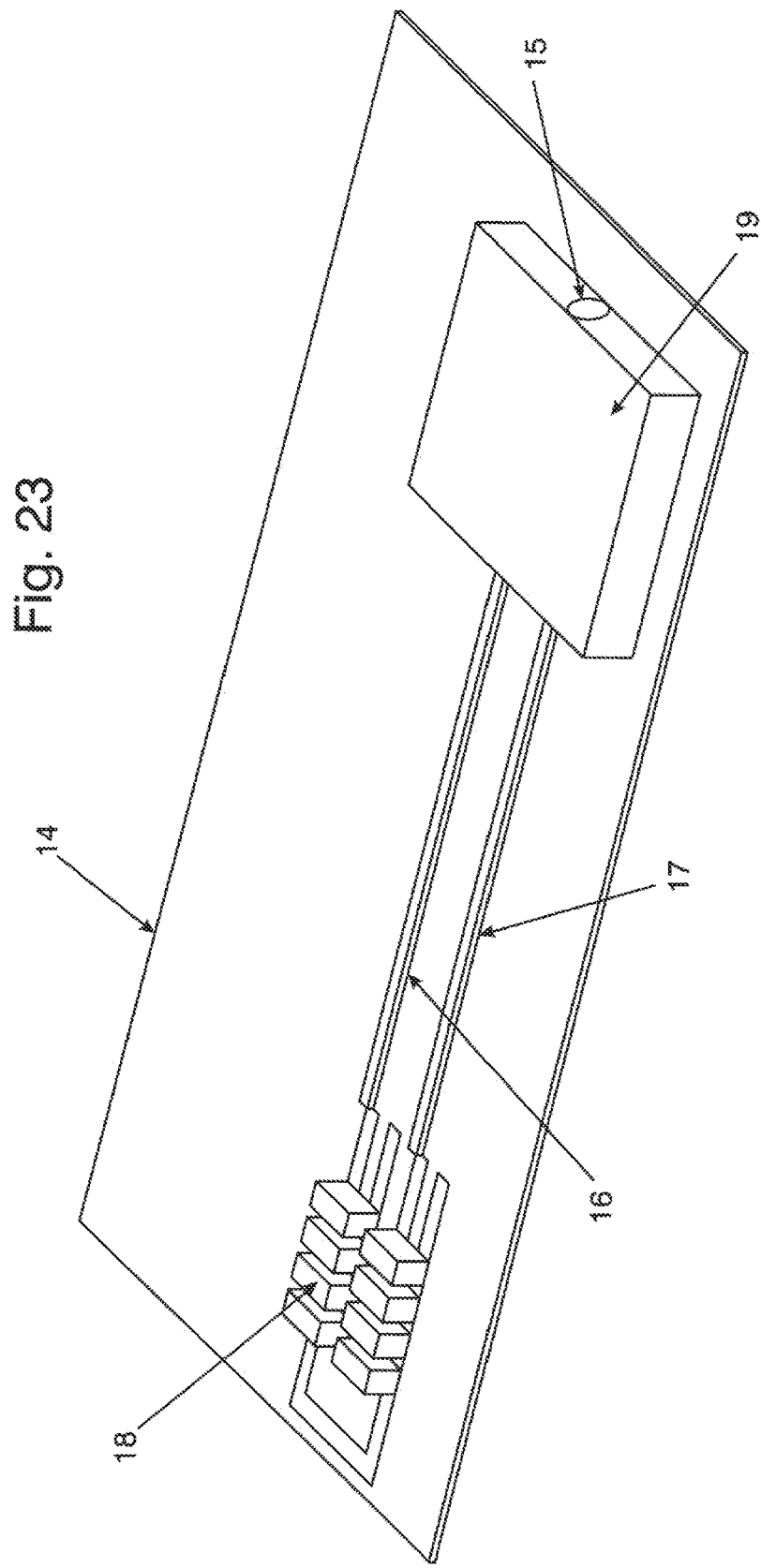

PYROELECTRIC GENERATOR

TECHNICAL FIELD

The present invention relates to the technical field of thermal-to-electrical energy conversion through the pyroelectric effect, in particular for temperature variation measurements. The present invention more specifically relates to a pyroelectric device and the use thereof, to a temperature variation measurement device, and to a method of measuring a temperature variation.

TECHNICAL BACKGROUND

Single element pyroelectric cells based on Lead Zirconate Titanate (PZT) or Polyvinylidene Fluoride (PVDF) are currently used for temperature variations detection.

Such single element pyroelectric cells are usually dedicated devices, being manufactured on purpose by using expensive materials and processes. In order to get enough current from such a device, the active surface area is usually made large, which may result, in turn, increasing the device size as well as the cost for manufacturing the device.

The object of the invention is to provide high performance pyroelectric generators, in particular for temperature variation detection, which are inexpensive, very sensitive and of small size, so as to be used in several microelectronic and industrial applications, where a reduced size and optimum temperature sensitivity are common requirements.

SUMMARY OF THE INVENTION

The mentioned problems and objects are solved by the subject-matter of the independent claims. Further preferred embodiments are defined in the dependent claims.

According to an embodiment of the present invention, a pyroelectric device is provided, comprising a plurality of layers of a polar dielectric material having a pyroelectric coefficient, p, wherein each layer exhibits pyroelectric properties; a plurality of conductive electrodes, wherein each conductive electrode is substantially in contact with at least a portion of one surface of a respective at least one of said plurality of layers of polar dielectric material, wherein said electrodes are electrically connected in a parallel configuration as to form a series of capacitors comprised of said plurality of layers of polar dielectric material and plurality of conductive electrodes.

According to other embodiments of the invention, use of a corresponding pyroelectric device and a method of measuring a temperature variation, measuring the output response of a corresponding pyroelectric device, are provided.

BRIEF DESCRIPTION OF THE DRAWINGS

Embodiments of the present invention, which are presented for better understanding the inventive concepts and which are not to be seen as limiting the invention, will now be described with reference to the figures in which:

FIG. 23 shows an integrated MLCC pyroelectric cell with utilizing device onboard according to a further embodiment of the invention.

DETAILED DESCRIPTION

Figure 1:
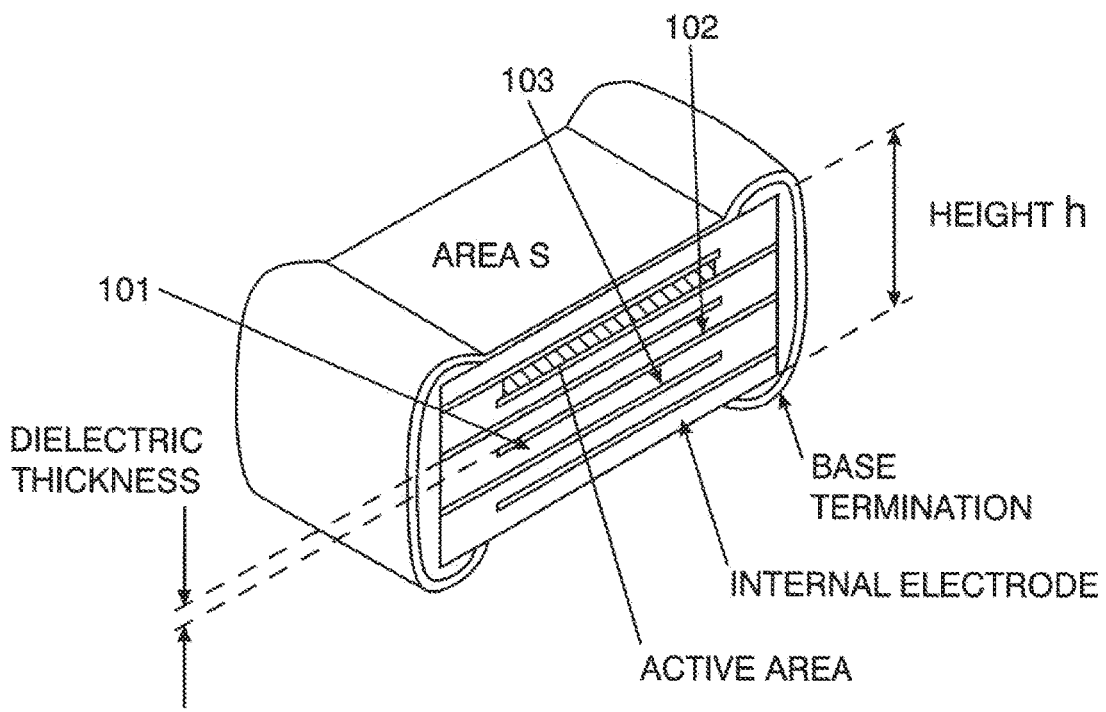
FIG. 1 shows the employment of an MLCC (Multi-Layer Ceramic Capacitor) structure in an embodiment of the present invention.

In general, due to the increase of the capacitors' effective surface permitted by the connection in a parallel configuration, embodiments of the present invention can achieve a high sensitivity and a high current output response.

According to a preferred embodiment of the invention, the pyroelectric device has been subjected to a suitable poling process, in order to force the ferroelectric domains of the material to align their dipoles in the same direction. Barium Titanate (BaTiO3), for example, can exhibit pyroelectric properties in its poled ceramic state. Poling means forcing the ferroelectric domains of the material to align their dipoles in the same direction. A strong electric field applied to BaTiO3 ceramic can cause the alignment of the domain polarization along the field direction. After removing the electric field, the material domains can be made to remain aligned. Commonly, the amount of the residual polarization depends on the temperature and the duration of the poling process.

An effective technique is to apply and maintain a strong electric field while the ceramic is cooling down through the Curie point (120° C.÷130° C. for BaTiO3). This technique induces a strong alignment in the material, because above the Curie point the domains are free to move and they can minimize the potential energy, arranging themselves along the electric field direction. When the ceramic is cooled below the Curie point, the re-arrangement of the domains is much more difficult and they tend to maintain the achieved alignment configuration, even when the poling electric field is switched off. The polarization charge of BaTiO3 ceramic, for a "well-poled" sample, i.e. for a nearly saturated polarization, is more than 8 μQ/cm2.

We have surprisingly and unexpectedly found that conventional non-poled small capacitors for electronic circuitry building, multi-layer ceramic capacitors, and, in particular, MLCCs can be effectively poled through the process described above. Said small capacitors for electronic circuitry building and MLCC were not damaged or deformed by the poling process, and they exhibited after the poling process described above substantially improved pyroelectric properties, characterized by a high reproducibility of the obtained pyroelectric constants, and by a comparatively high current output in response to temperature variations.

In general, pyroelectric materials respond to changes in temperature giving rise to electrical charges on the material's surface. The generated current of pyroelectric cells is based on the pyroelectric effect, converting temperature variation to a corresponding electrical output. The pyroelectric current is given by $$I_p = dQ/dt = p \cdot A \cdot dT/dt,$$

where p is the pyroelectric coefficient and A is the area of the electrode surface.

According to a preferred embodiment of the invention, the plurality of layers of a polar dielectric material and the plurality of conductive electrodes are stacked vertically one on top of another. A small compact size of the pyroelectric device can be thereby achieved.

According to another preferred embodiment of the invention, the series of capacitors comprises at least two or three capacitors. Due to the increase of 2 or 3 times of the capacitors effective surface permitted by the connection in a parallel configuration, higher sensitivity and higher current output response can be achieved.

According to another preferred embodiment of the invention, the series of capacitors comprises more than ten capacitors. Due to the increase of more than 10 times of the capacitors effective surface permitted by the connection in a parallel configuration, an increased sensitivity and current output response can be achieved.

According to another preferred embodiment of the invention, the plurality of layers of a polar dielectric material and the plurality of conductive electrodes stacked vertically one on top of another are integrated in a MLCC capacitor (Multi-Layer Ceramic Capacitor) of small size, for example smaller than 5 or 1 mm.

Conventional MLCCs (Multi-Layer Ceramic Capacitors) of small size are nowadays commercially available in large quantity and very inexpensively. According to embodiments of the present invention pyroelectric devices can be thereby made available at low cost, and can be used in plenty of industrial applications, where usually a very small size and a very high sensitivity to temperature variations are required.

Figure 2:
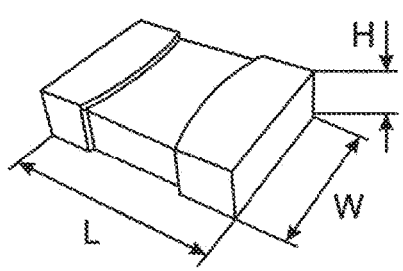
FIG. 2 shows the nomenclature and size of several conventional MLCC devices.

An observed trend in the miniaturization of MLCCs (Multi-Layer Ceramic Capacitor) is the effort to increase the capacitance volumetric efficiency (μF/cm3). A typical monolithic MLCC structure is shown in FIG. 1. A number of dielectric layers and conductive layers are alternately stacked up: the odd conductive layers are electrically connected at one end and the even conductive layers are, in turn, electrically connected at the opposite end; these two external terminations form the electrical contacts of the capacitor plates. The capacitance Ct of an MLCC can be represented by:

$$Ct = \varepsilon 0 \cdot \varepsilon r \cdot N \cdot S/d,$$

where S is the overlap area of internal electrodes, N is the number of the individual dielectric layers, εr is the relative dielectric constant of the ceramic BaTiO3 dielectric, d is the thickness of the dielectric layer, and ε0 is the dielectric constant of vacuum. The typical structure of an MLCC capacitor is represented in FIG. 1. In FIG. 2 a general view of the device is shown with the partial list of the EIA codes for the different sizes of commercially available MLCCs.

Figure 3:
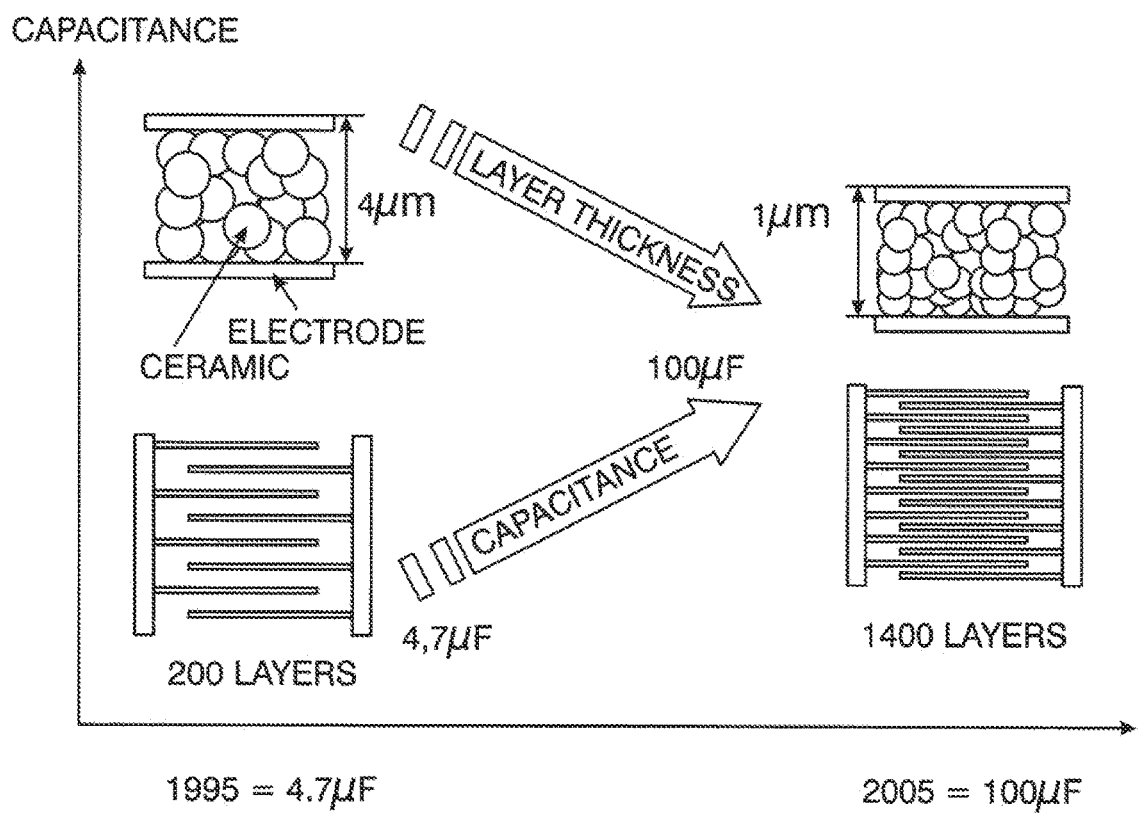
FIG. 3 shows MLCC evolution with regard to reducing the layer thickness and increasing the number of layers for increasing the capacity.

During the years, the manufacturing technology of these devices achieved continuous improvements, with higher capacity and reduced size, due to the increased number of layers and the reduced layer thickness. This evolution is shown in FIG. 3.

Following the above considerations, an MLCC capacitor is characterized by two main parameters: its active (overlap) area A (the real "face-to-face surface" of the conductive layers) and the number of the ceramic (BaTiO3) dielectric layers N. The resulting capacity is then proportional to A multiplied by N. Therefore, a multilayer capacitor with active area A can be considered equivalent to a traditional capacitor with two face-to-face parallel plates separated by the same dielectric material, having an effective plate area of N.×A. For example, the 1210 coded MLCC capacitor (3.2 mm×2.5 mm) has 500 layers and its active area is 6.5 mm2: it is equivalent to a "flat capacitor" with a plate area of 3250 mm2.

Thanks to employing such MLCCs for building the pyroelectric devices according to embodiments of the present invention, the pyroelectric device can exhibit a size smaller than 5 mm×5 mm, preferably smaller than 2 mm×2 mm. At the same time, effective active areas larger than 2000 mm$^2$, preferably larger than 3000 mm$^2$, can be achieved.

According to another preferred embodiment of the invention, conductive electrodes layers are arranged vertically one on top of another, and separated by polar dielectric material layers in-between, and said conductive electrodes layers are alternately electrically interconnected together, so as to build a stack of several capacitors piled one above another, and connected in parallel.

According to a further preferred embodiment of the invention, at least one layer of said polar dielectric material comprises a BaTiO$_3$ (barium titanate) layer. Barium Titanate (BaTiO3), like other ferroelectric materials, exhibits outstanding pyroelectric properties in its poled ceramic state. Barium Titanate can be used in its undoped form but, more frequently, it can be doped with other chemical species to achieve an improved behavior of the material (temperature stability, etc.). Calcium, Strontium, Zirconium are possible dopants, but several other species can be used.

According to another preferred embodiment of the invention, at least one of said electrodes is a precious-metal-electrode (PME), comprised of platinum, gold, silver-palladium, or, alternatively, conductive oxides, iridium oxide, nickel, or generally a base-metal-electrode (BME).

According to another preferred embodiment of the invention, the pyroelectric device comprises at least a top electrode, a layer of barium titanate, a first interim electrode, another layer of barium titanate, a second interim electrode, a third layer of barium titanate, and a bottom electrode resulting in at least three capacitors electrically connected in parallel.

According to another preferred embodiment of the invention, said pyroelectric device has an output response resulting from exposure to temperature variations. The pyroelectric device provides advantageously temperature variations detection with a greater output response than conventional single-element temperature variations detectors.

According to another preferred embodiment of the invention, the output response is an output current proportional to the area A of the series of capacitors, or a pyroelectric current, I, monitored for example as a pyroelectric voltage drop, V, across an external resistor, or as a power. The pyroelectric device is advantageously used in either a contact or in a non-contact temperature variation measurement device.

Using standard commercial ceramic capacitors (MLCC), which employ $BaTiO_3$ as dielectric material, we can rely on a large effective surface area and on a high pyroelectric constant, joined with a very low cost, a very small size and a strong modularity capability. This makes very attractive this solution which can provide inexpensive and small size devices, with surprisingly high performances.

A ceramic capacitor well-poled, as described above, can generate current when its temperature changes due to the pyroelectric effect, like standard pyroelectric cells. $BaTiO_3$, for example, is a material with appreciable pyroelectric properties and with the advantage that it is commonly used as dielectric in cheap and small size devices like chip capacitors (MLCC), whose effective electrode area reaches very high values, due to the large number of stacked layers. Therefore, we can take advantage from a well-established industrial technology and use high quality standard capacitors, which have undergone a poling process, to make compact pyroelectric cells and devices with very high efficiency and very low cost.

Comparing "chip capacitor cell" (MLCC) as of embodiments of the present invention to conventional pyroelectric cells (commonly being manufactured using special materials and expensive techniques), the difference in their performance can be pronounced. Specifically, the efficiency of "chip capacitor cells" according to embodiments of the present invention can substantially exceed the one of the conventional pyroelectric cells, with smaller overall dimensions and dramatically reduced cost.

FIG. 1 shows the employment of an MLCC (Multi-Layer Ceramic Capacitor) structure in an embodiment of the present invention. According to this embodiment, a pyroelectric device comprises a plurality of layers of a polar dielectric material having a pyroelectric coefficient, p, wherein each layer exhibits pyroelectric properties; a plurality of conductive electrodes, wherein each conductive electrode is substantially in contact with at least a portion of one surface of a respective at least one of said plurality of layers of polar dielectric material, wherein said electrodes are electrically connected in a parallel configuration as to form a series of capacitors comprised of said plurality of layers of polar dielectric material and plurality of conductive electrodes.

The conductive electrodes layers are arranged vertically one on top of another, and separated by dielectric material layers in-between, and said conductive electrodes layers are alternately electrically interconnected together, so as to build a stack of several capacitors piled one above another, and connected in parallel.

Specifically, an MLCC 1 is a multi-layer ceramic capacitor, built by several layers of dielectric materials 101 separated by conductive electrodes layers 102 in-between connected in a parallel configuration. A single MLCC 1 therefore comprises a number of thin capacitors 103, which number corresponds to the number of dielectric layers 101 stacked one above another. The term capacitor can therefore refer to a whole MLCC device 1, but also to one single dielectric layer 101 and the two adjacent conductive electrodes layers 102 in the MLCC. As shown in FIG. 1, MLCCs have approximately the shape of a rectangular parallelepiped. At two ends, conductive metallizations 2, 3 contact the two sets of interpenetrating layers, which form the capacitor plates.

Figure 18:
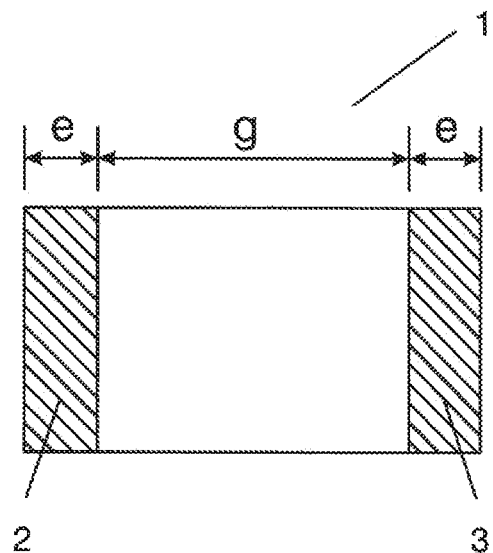
FIG. 18 shows a top view of an MLCC pyroelectric device according to an embodiment of the invention.
Figure 19:
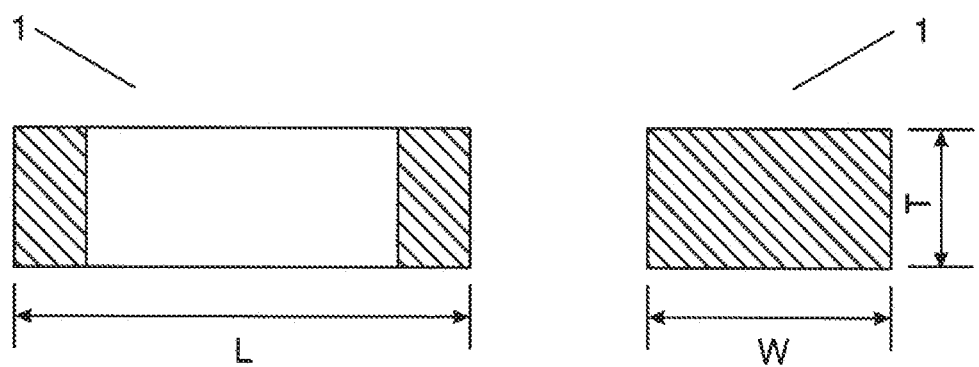
FIG. 19 shows a side view of an MLCC pyroelectric device according to an embodiment of the invention.

MLCC devices according to the embodiments of the present invention have been subjected to a suitable poling process, in order to force the ferroelectric domains of the material to align their dipoles in the same direction. In FIGS. 18 and 19 schematic top and side views of chip capacitors 1 (MLCC) with the contact electrodes 2 and 3 are shown. In a way, MLCCs can be seen as a base component of the pyroelectric cells and/or devices according to an embodiment of the present invention. Preferably, the number of layers 101 is between 100 and 500, a single layer active area is between 1 and 10 mm2, a total effective area for the device is between 500 and 3000 mm2, and the MLCC has a geometrical surface between 1 and 30 mm2. Further, values for the pyroelectric constant are preferably in the range of 10 to $30 \times 10(-9)$ Coulomb/(cm2·° C.), but also higher value can be possible, depending on the manufacturing technology of the device as well as on the effectiveness of the poling process.

In order to perform the poling process at the Curie point we heat the capacitor at a temperature in the range 120° C.÷150° C. An electric field in the range 10 kilo-Volt/cm÷60 kilo-Volt/cm is then applied, depending on the manufacturing technology of the device, for about 2 hours. Then free cooling down to room temperature occurs.

According to a further embodiment, poling is performed at lower temperatures, which allows higher electrical fields to be applied without damaging the device. Specifically, the device can be cooled down to −18° C. and then exposed for two hours to an electric field in excess of 300 kilovolt/cm, allowing subsequently the device to return freely to room temperature.

Figure 20:
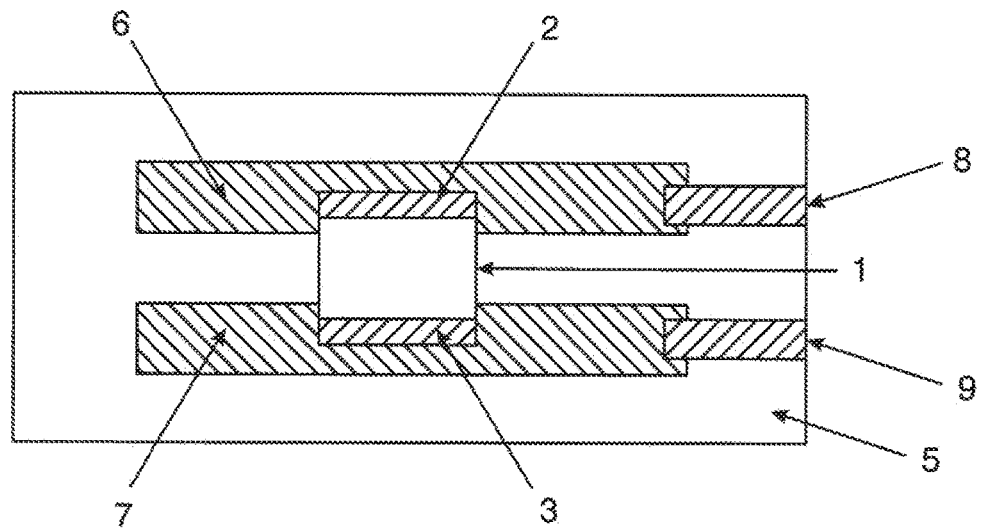
FIG. 20 shows a single MLCC pyroelectric cell according to an embodiment of the invention.

A further embodiment of the present invention is shown in FIG. 20 as a pyroelectric cell 4, wherein a single MLCC capacitor 1 is put onto a substrate 5, which exhibits on its surface two conductive rails 6 and 7. The conductive metal electrodes 2, 3 of the MLCC capacitor are brought electrically in contact with the rails 6 and 7, respectively. A clamp of any kind of conductive soldering material, not shown in the figure, can be used to get reliable contacts between the chip and the rails. The latter can be extended along the substrate to provide possible contacts 8 and 9 with an external utilizing device. Normally, if the pyroelectric cell is used inside or joint to another appliance, the latter could be conveniently used as a substrate for the MLCC chip, and it would be just necessary to provide suitable electrical contacts and an adequate capacitor fixing.

Figure 21:
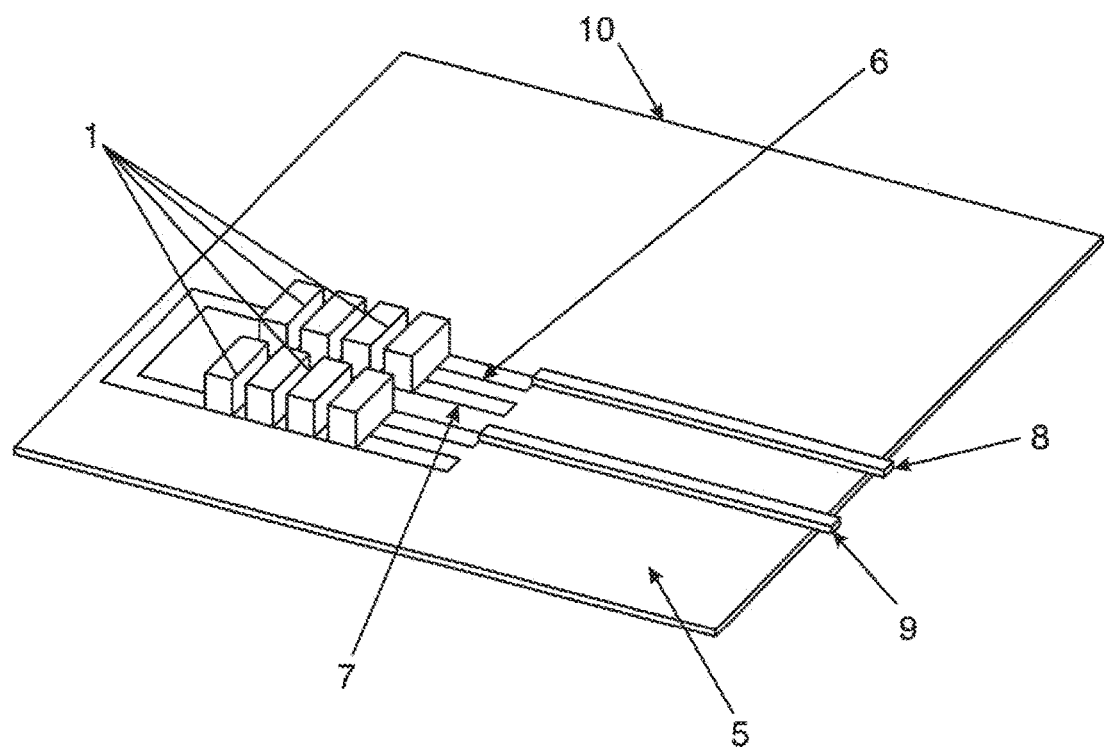
FIG. 21 shows a multichip MLCC pyroelectric cell, according to an embodiment of the invention.
Figure 22:
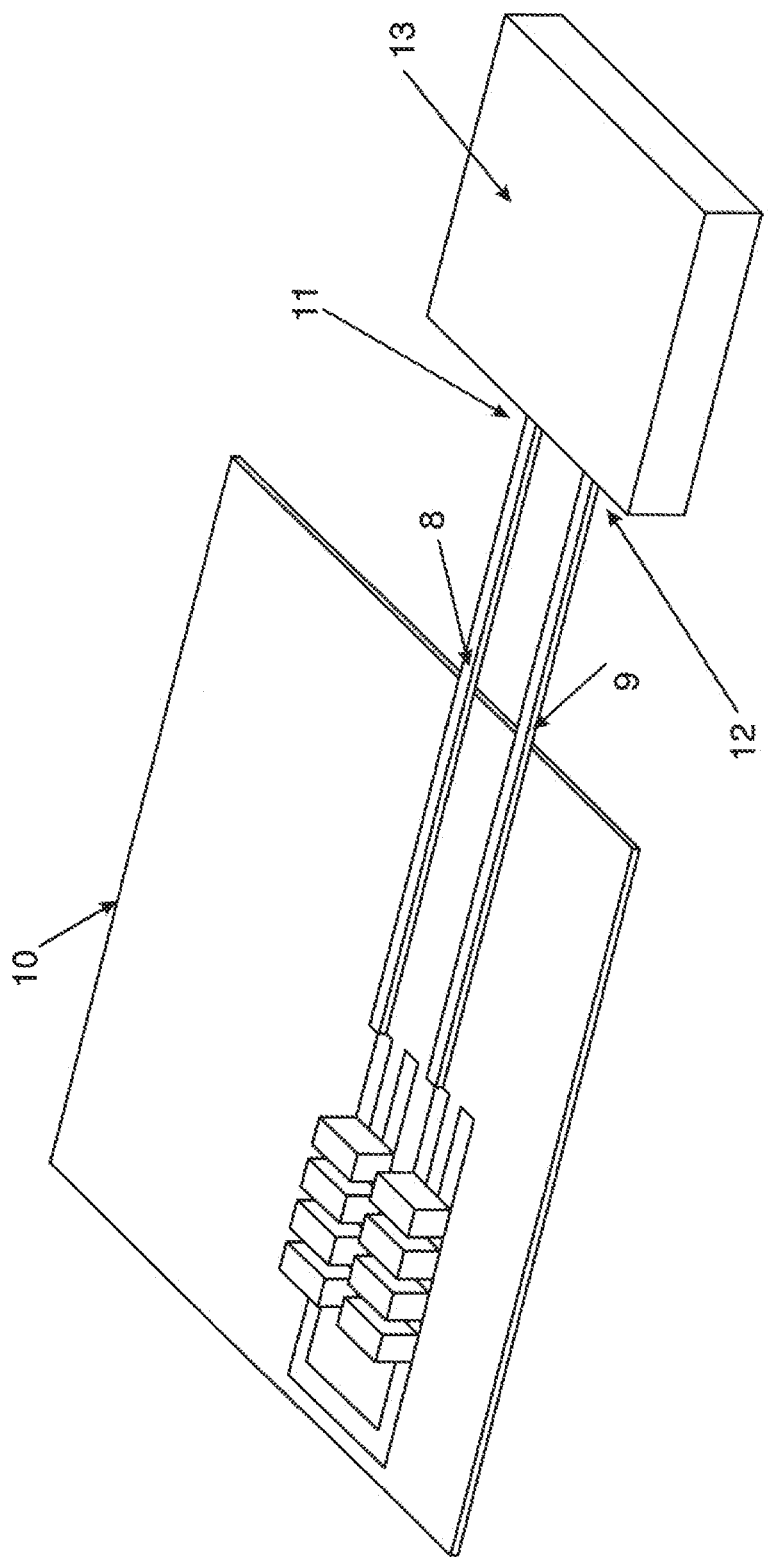
FIG. 22 shows an MLCC pyroelectric cell driving an external device, according to a further embodiment of the invention.

FIG. 21 shows a further embodiment of the present invention, in which a more powerful cell 10 with higher current output is made using several MLCC chip capacitors either with similar or different characteristics. A plurality of MLCCs 1 are suitably connected in parallel onto a substrate 5 to form the multichip pyroelectric cell 10; the capacitor contact rails can be extended along the substrate 5 to provide an external output current pathway for a utilizing device. In FIG. 22 such a device 13 is shown, where the device input 11 and 12 are connected to the external pyroelectric cell contacts 8 and 9, respectively. The device could be also provided with additional electrical connections to exchange either signals or energy with some other appliance.

In a further embodiment, shown in FIG. 23, a further integration can be obtained placing the utilizing device onto the same substrate 5, where the MLCC capacitors lie: the integrated pyroelectric cell 14 is built by the pyroelectric source 18 connected via connectors 16 and 17 to the utilizing device 19, which is on board. In this embodiment, the device has an additional input/output device port 15, as mentioned above.

Regardless of the actual number of used MLCCs, for either external or integrated utilizing devices, further embodiments of the present invention additionally consider at least a loading and/or a charge storing circuit. The utilizing devices are not necessarily limited to such a circuit: possible additional modules could be added, like RFIDs, radio transmitters, LEDs etc.

Yet further embodiments of the present invention, since a pyroelectric cell measures a temperature variation, consideration is made of mounting the MLCC chip capacitors in such a way that the optimum thermal exchange can take place between the environment and the capacitors, leaving enough space between adjacent chips or bringing them in contact with thermally conductive surfaces. Further, also the substrate can be considered for providing an adequate thermal exchange.

The following experimental results and examples illustrate the advantages of embodiments of the invention, through the comparison with "reference devices", manufactured according to the state of the art.

As a first example 1, it is referred to the paper by J. Xie, X. P. Mane, C. W. Green, K. M. Mossi, K. K. Leang: "Performance of Thin Piezoelectric Materials for Pyroelectric Energy Harvesting" (in: Journal of Intelligent Material Systems and Structures February 2010 vol. 21 no. 3 243-249). In this published paper, the performances of pyroelectric cells made of three different materials currently used are studied. In Table 1 several properties for the three pyroelectric materials are summarized:

| Sample | Thickness (μm) | Area (cm2) | Pyroelectric coefficient (μC/m2/K) | Capacitance (nF) | Curie temp. (° C.) |
|---|---|---|---|---|---|
| PZT-5A | 150 | 1.44 | 238 | 45 | 350 |
| PMN-PT | 273 | 0.98 | 416 | 15 | 150 |
| PVDF | 110 | 1.96 | 9 | 0.090 | 165 |

Figure 4:
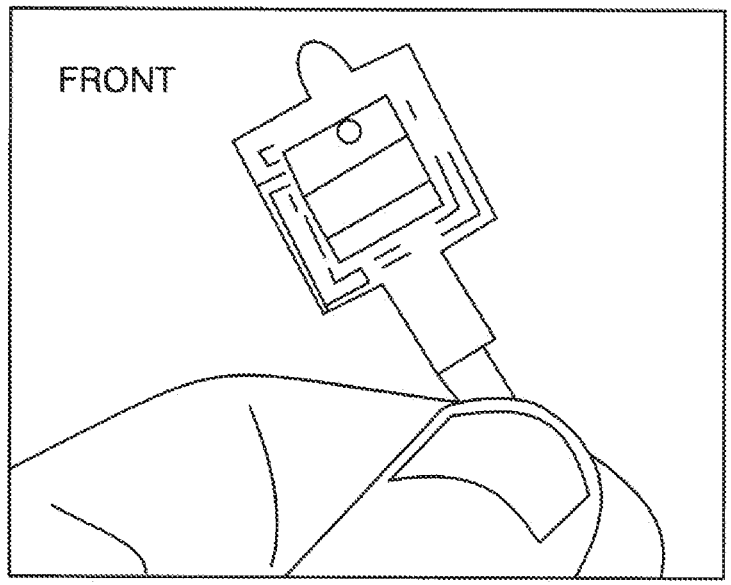
FIG. 4 shows a front view of a PZT-5A sample of an Example 1.
Figure 5:
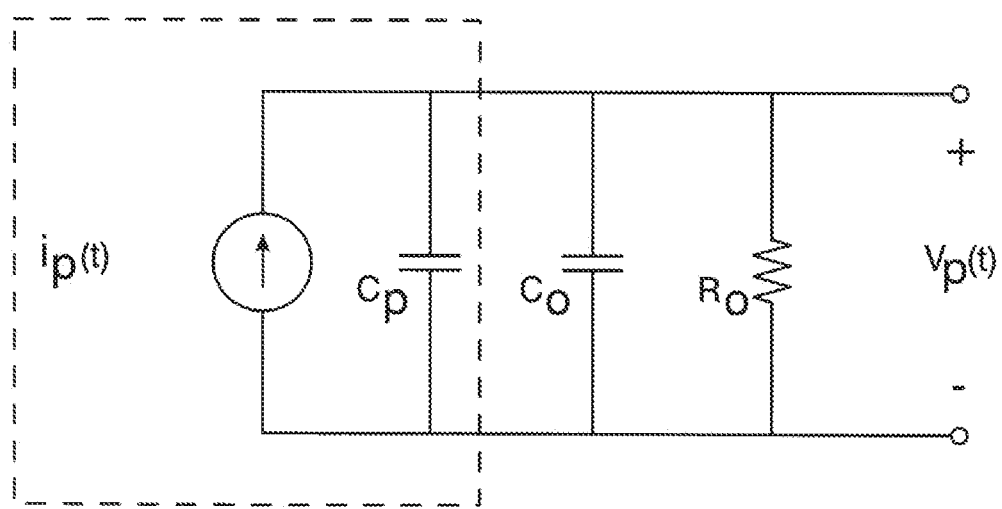
FIG. 5 shows a model of a pyroelectric element used in Example 1.

The PZT-5A cell is shown in FIG. 4. The pyroelectric cell is tested using the electric circuit described in FIG. 5, where the load capacitance $C_{load}=0$ and the load resistance $R_{load}=1$ MΩ (megaohm). The circuit represents a lumped-parameter model of a pyroelectric element, which is modeled as a current source $I_p(t)$ in parallel with an internal capacitance $C_p$, connected in parallel to an external capacitor $C_o$ and a resistor $R_o$. The current $I_p(t)$ is proportional to the rate of the change of temperature of the device. The voltage generated by the pyroelectric element is denoted by $V_p(t)$.

Figure 6:
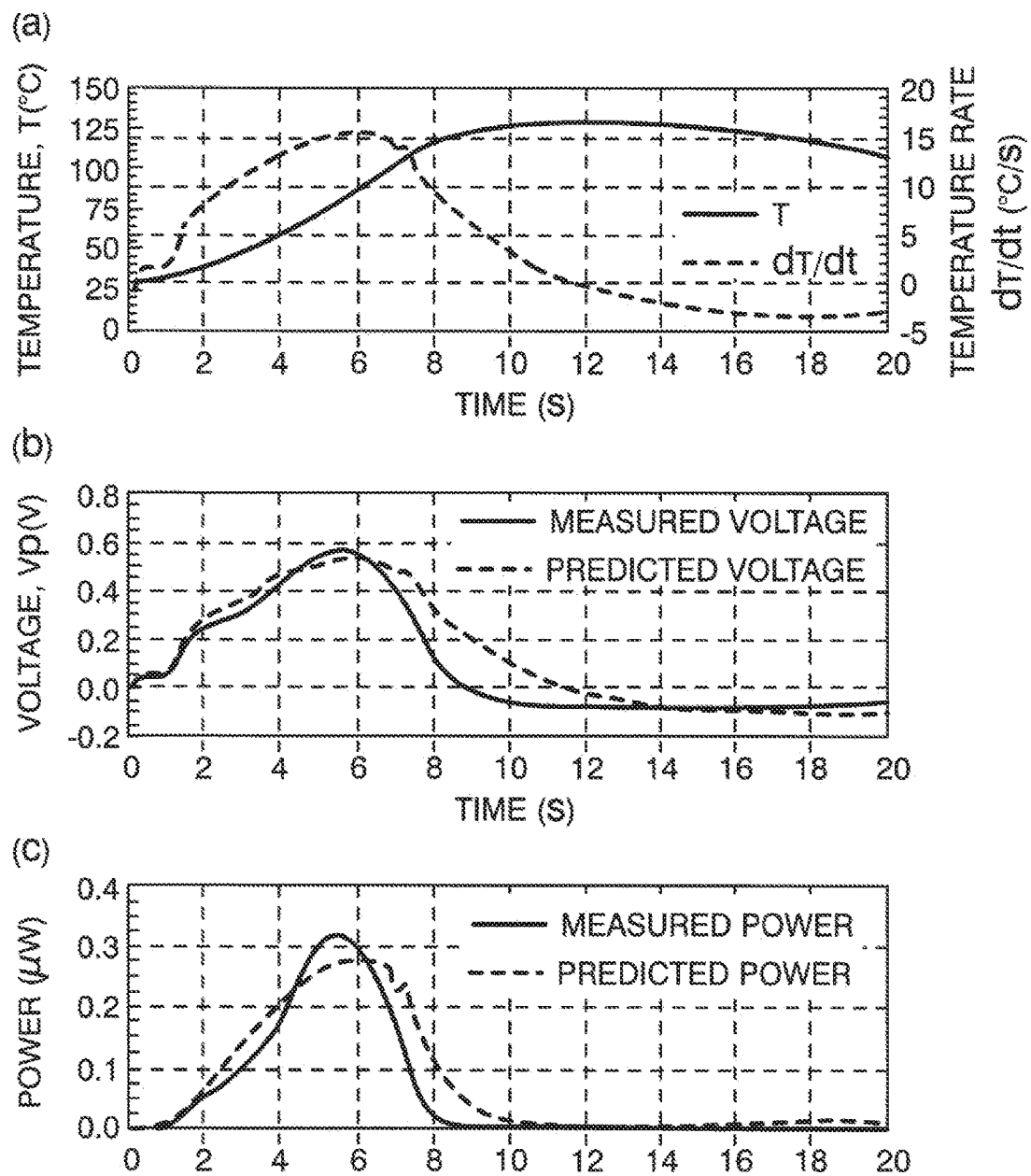
FIG. 6 shows measured and predicted results of power generated by a PZT-5A element in Example 1.
Figure 7:
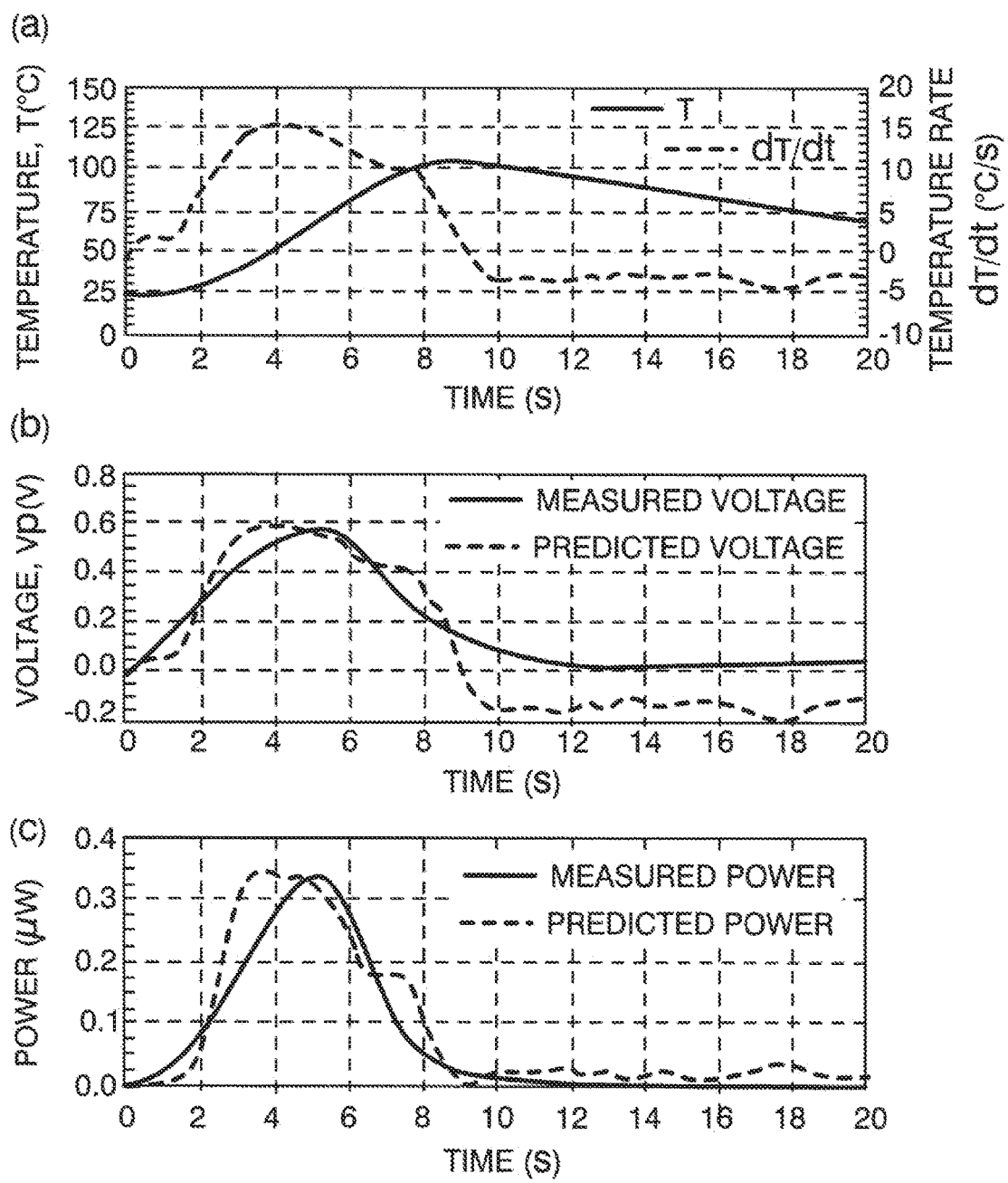
FIG. 7 shows measured and predicted results of power generated by a PMN-PT element in Example 1.
Figure 8:
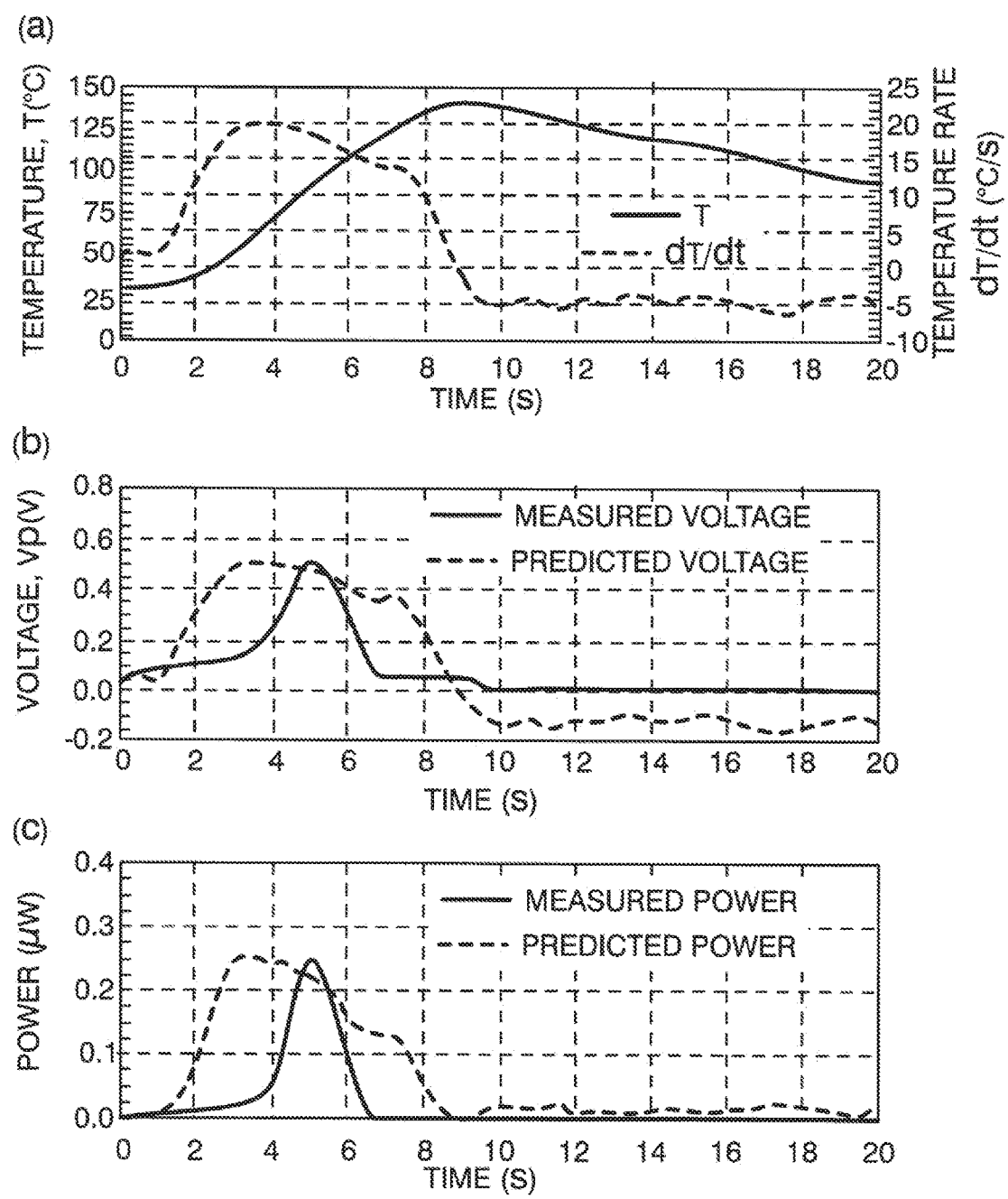
FIG. 8 shows measured and predicted results of power generated by a PVDF element in Example 1.

The experiments have been performed under a rather fast rate of variation of the temperature (suitable for sensor applications), achieving a peak heating rate of about 15° C./s (FIGS. 6, 7 and 8 for the different materials). For each type of cell the measured and predicted results are shown in the figures: (a) temperature and temperature rate (dT/dt) vs time; (b) measured and predicted voltage vs time; (c) measured and predicted power vs. time. All obtained results are summarized in the Table 2 (published scientific literature):

| Sample | Measured | Predicted | Difference |
|---|---|---|---|
| | Peak Voltage (V) | | |
| PZT-5A | 0.53 | 0.58 | 9% |
| PMN-PT | 0.57 | 0.59 | 4% |
| PVDF | 0.49 | 0.53 | 8% |
| | Peak power (μW) | | |
| PZT-5A | 0.28 | 0.33 | 16% |
| PMN-PT | 0.33 | 0.35 | 6% |
| PVDF | 0.24 | 0.26 | 8% |
| | Power density (μW/cm2) | | |
| PZT-5A | 0.20 | 0.23 | 14% |
| PMN-PT | 0.33 | 0.36 | 9% |
| PVDF | 0.12 | 0.13 | 8% |

Looking at the peak power obtained from the cells, the best performance is achieved with PMT-PT. With a cell area of 98 mm2, a temperature difference ΔT=82° C. generates a peak power of 0.35 μWatt.

Figure 9:
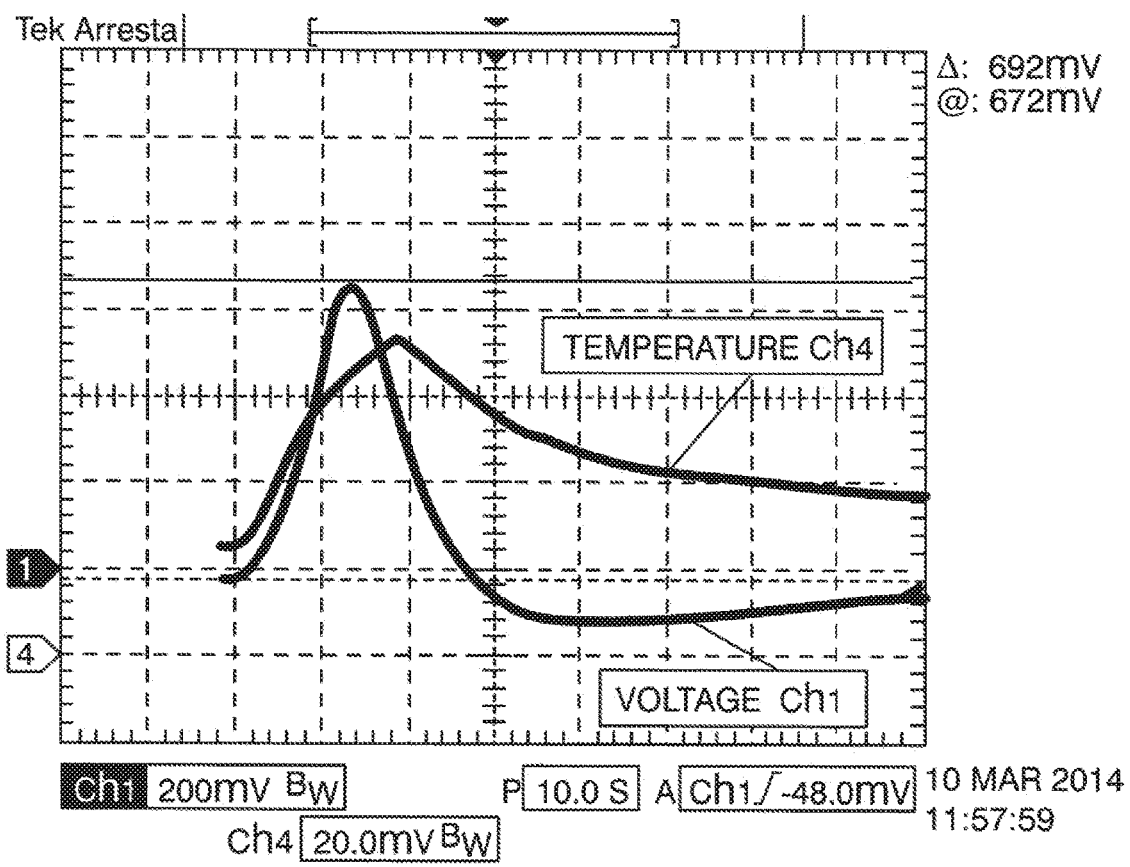
FIG. 9 shows a single MLCC test employing a temperature scale of 1 mV/1° C. and a 1 MΩ) load resistor according to an embodiment of the present invention.

The above experimental data of a conventional device is now compared to data obtained with a device according to an embodiment of the present invention. Specifically, a single MLCC chip capacitor (EIA code 1210, 22 μF capacitance, 8 mm² area, 1.6 mm thickness—Manufacturer: Murata, Part Number: GRM32CF51A226ZA01) has been poled accordingly. A hair dryer air flow has been used to heat the sample, whose temperature was measured by means of a thermocouple with a conversion factor of 1 mV/1° C., connected to an oscilloscope, which is used also to measure the voltage across the chip. The temperature vs. time curve can be acquired simultaneously with the voltage vs. time curve. The MLCC capacitor was initially at room temperature (25° C.) and was heated up to about 75° C. at a rate of 2.94° C./s. The external loading circuit used for the test had a loading resistance Rload=1MΩ) and the probe impedance was 10MΩ. The results of our test are shown in FIG. 9.

Remarkably, with a temperature difference of ΔT=50° C. a peak voltage of 0.692 V can be obtained. The resulting peak power is $V^2/R$, where V is the peak voltage and R is the shunt between the load impedance Rload and the probe impedance (1 MΩ//10MΩ=0.909 MΩ). Therefore, the peak power turns out to be (0.692 V)2/(0.909 MΩ)=0.526 μW.

Using a single MLCC capacitor and exploiting a smaller temperature variation with respect to the reference device, a higher peak power with a smaller device size can be obtained. In Table 3, the results are compared for devices according to an embodiment of the present invention (e.p.i.) and from the example taken from above scientific literature (numerical values in parentheses showing improvement):

| | ΔT (° C.) | Peak power (μW) | Surface area (mm2) | Volume (mm3) |
|---|---|---|---|---|
| PMN-PT | 82 | 0.350 | 98 | 26.75 |
| e.p.i. | 50 (×0.6) | 0.526 (×1.5) | 8 (×0.08) | 12.8 (×0.48) |

Figure 10:
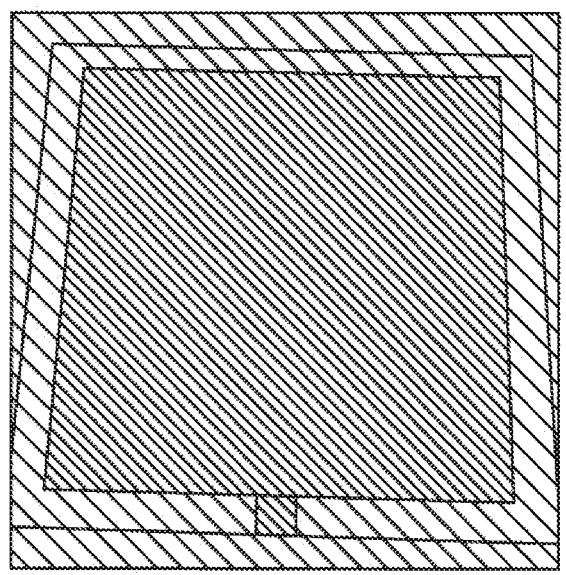
FIG. 10 shows a PZT cell with 4 cm side length of an Example 2.

As a second example 2, it is referred to the paper by A. Cuadras, M. Gasulla, V. Ferrari: "Thermal Energy Harvesting through Pyroelectricity" (in: Sensors and Actuators A: Physical, Vol 128(1) March 2010, pp.132-139). In this published paper, the performances of pyroelectric cells made of PZT and PVDF are studied, using both fast and slow temperature variation rate. As previously mentioned, the fast rate is suitable to characterize the device for sensor applications, whilst the slow rate simulates better the case of energy harvesting from environment. The PZT cell on an alumina substrate, used for the study, is depicted in FIG. 10. It is a 4 cm×4 cm square device and the bottom electrode has an accessible contact. Thickness and poling field strength for the used samples are described in Table 4 taken from in the above scientific literature in which PZT cells are fabricated for the experiments and the PZT thickness and poling field were changed among the samples while area (4 cm×4 cm) was kept constant:

| PZT Sample ID | Target thickness (µm) | Poling field (V/µm) |
| --- | --- | --- |
| 1 | 60 | 5 |
| 2 | 60 | 7 |
| 3 | 100 | 5 |
| 4 | 100 | 7 |

Figure 11:
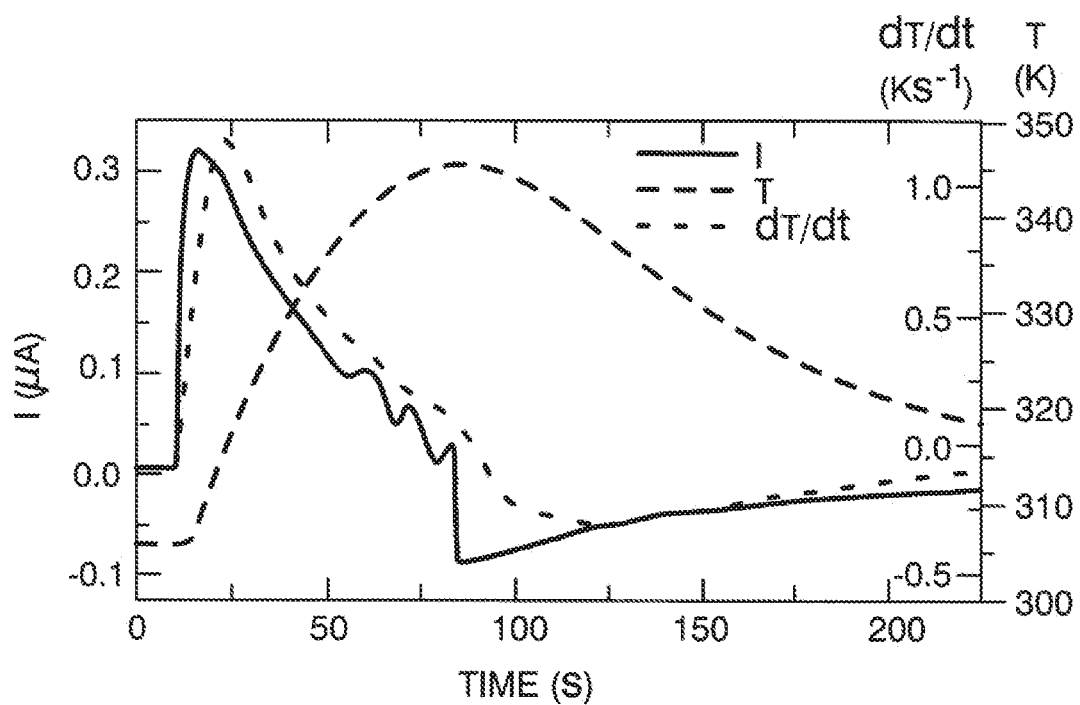
FIG. 11 shows measured values of current I and temperature T over the time for PZT cell # 3 of Example 2.

PZT cells were heated with a hair dryer from room temperature up to about 77° C. (350° K), letting them subsequently cool down. The value of the temperature variation rate has been numerically calculated from the measured data and it turns out to be dT/dt=1.15° C./s; the measured peak current is Ip=0.32 µA. The current I and the temperature T over the time for the PZT cell #3 are shown in FIG. 11.

In Table 5 are summarized the total generated charge (Q), the generated charge per unit area (Ps), and the maximum measured current (Imax). The charge Q has been inferred from the integration of the positive area enclosed under the I(t) curve:

| PZT Sample | Q (µC) | Ps (10-2Cm-2) | Imax (µA) | λexp (10-4Cm-2K-1) |
| --- | --- | --- | --- | --- |
| 1 | 4.8 | 0.30 | 0.23 | 0.75 |
| 2 | 8.1 | 0.51 | 0.28 | 1.28 |
| 3 | 11.3 | 0.71 | 0.32 | 1.78 |
| 4 | 17.0 | 1.06 | 0.40 | 2.65 |

Similar experiments have been performed using commercial PVDF cells; the heating conditions used during the tests were less severe, to avoid to damage the material; in fact, the PVDF cells can be degraded, when exposed to too high temperatures. The characteristics of the used commercial PVDF cells are shown in Table 6, where different areas and thicknesses were tested and the relative permittivity provided by the manufacturer is εr~12 to 13:

| PVDF Sample ID | Commercial ID | Thickness (µm) | Area (cm2) | Size (cm × cm) |
| --- | --- | --- | --- | --- |
| A1 | 2-1002908-0 | 64 | 3.60 | 3.0 × 1.2 |
| A2 | 1-1003744-0 | 40 | 7.44 | 6.2 × 1.2 |
| A3 | 1-1002150-0 | 40 | 29.64 | 15.6 × 1.9 |

Figure 12:
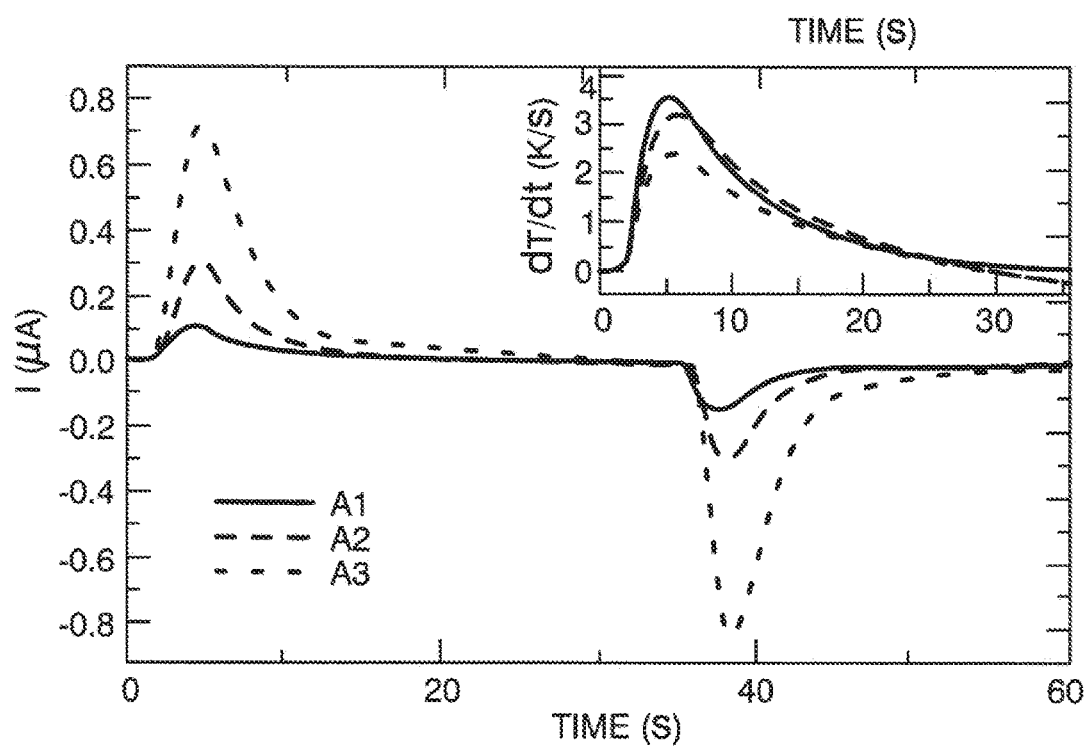
FIG. 12 shows measured current for the three PDVF cells of Example 2.

The samples have been both heated and forced to cool down with the dryer, to get approximately the same heating and cooling duration. Temperature has risen only to 67° C., to avoid cell degradation, as mentioned before. The results are depicted in FIG. 12, where the measured currents in the three PDVF cells are drawn for a temperature excursion of 37° C.; in this case the hair dryer first generates hot air and then, switched to fan mode, cools down the samples (forced-cooling); the area of the curves, related to pyroelectric charge, increases with the area of the samples, reported in the table above. The results are summarized in Table 7, where the values of charge and current generated during the heating phase for the three PVDF cells are shown (Ps for A3 is lower than for A1 and A2 because of its length did not allow a uniform heating):

| PVDF Sample | Q (µC) | Ps (10-2Cm-2) | Imax (µA) | λexp (10-4Cm-2K-1) |
| --- | --- | --- | --- | --- |
| A1 | 0.84 | 0.23 | 0.13 | 0.62 |
| A2 | 1.8 | 0.24 | 0.29 | 0.62 |
| A3 | 4.4 | 0.15 | 0.84 | 0.40 |

The best result from this first series of experiments has been obtained with the PZT cell #4, having a layer thickness of 100 µm; the total device thickness, including the ceramic substrate and the electrodes, turns out to be about 745 µm.

Another series of experiments has been performed using a PZT cell to reproduce slow temperature variation conditions; as mentioned before, this simulates the environmental situation for energy harvesting.

Figure 13:
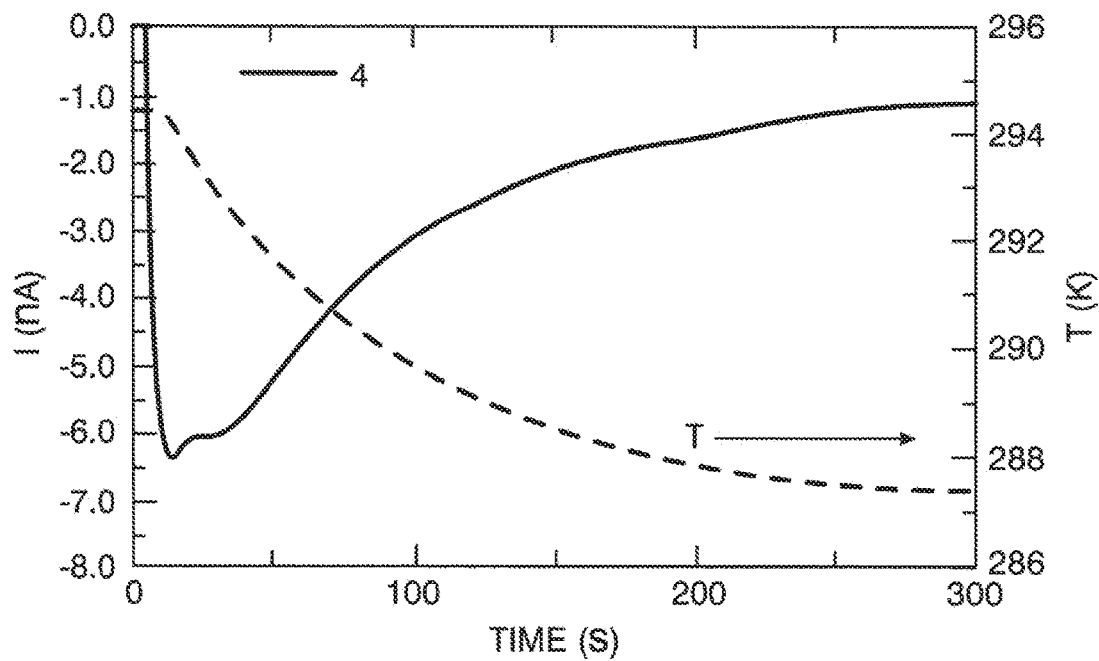
FIG. 13 shows temperature T and generated current I for PZT cell #4 of Example 2 when placed at the air conditioner outlet.

The pyroelectric PZT cell #4 was tested using a common office air conditioning system. The initial room temperature was 22° C. After switching on the air conditioner, the air temperature decreases to reach the set value of 14° C. PZT cell #4 was placed in proximity of the conditioner outlet and was exposed to a temperature variation of about 8° C. over a time of several hundred seconds (slow rate), as depicted in FIG. 13. The results of this test can be summarized as follows: with ΔT=8° C., a peak current of 6 nA and an accumulated charge of 1.3 µC can be obtained.

The above experimental data of a conventional device is now compared to data obtained with a device according to an embodiment of the present invention. Specifically, a pyroelectric cell was manufactured using four ceramic capacitors of the same type used before, connected in parallel: since the capacity of a single capacitor is 22 µF we can get a total capacity of 88 µF with a total surface area of 4×8 mm2=32 mm2. To measure the accumulated charge, an electrolytic load capacitor Cload=100 µF has been used. The generated charge Q can be obtained integrating the current I over the time; the value of Q can be inferred also from the measured voltage V across the load capacitor: Q=Cload·V. We tested both cases: a) fast T variation rate and b) slow T variation rate.

Figure 14:
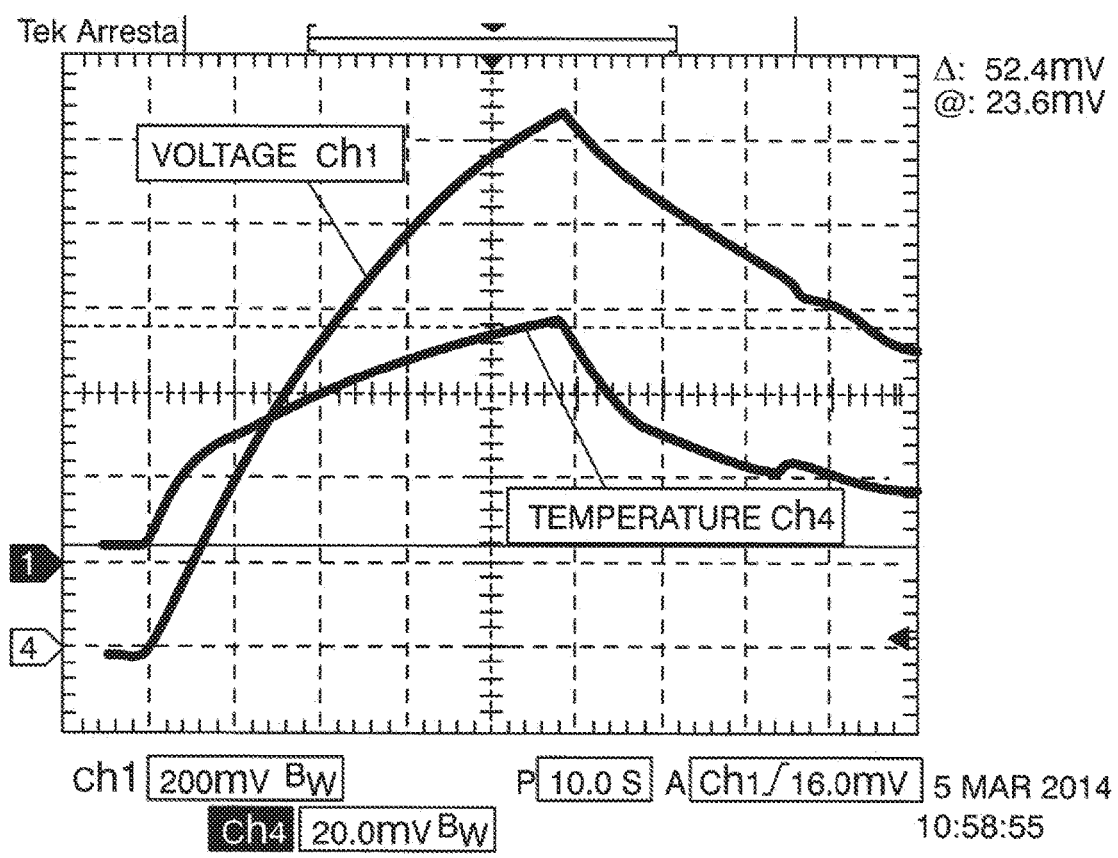
FIG. 14 shows a test of four MLCCs cells at a fast rate employing a temperature scale of 1 mV/1° C. and a 100 μF load capacitor according to an embodiment of the present invention.

For the fast T variation rate, the cell was heated with the hair dryer from room temperature up to 76° C., during a time interval of about 50 s: therefore, the resulting ΔT was about 52° C. with dT/dt=1.04° C./s. The graph obtained from this test is illustrated in FIG. 14. The results achieved with the "four capacitors cell" are: peak voltage $V_p$=1.3V; accumulated charge Q=Vp·Cload=1.3V·100 µF=130 µC.

The comparison with the previous reference PZT cell #4 (fast T variation rate) is summarized as follows in Table 8:

|  | ΔT (° C.) | Total charge (μC) | Surface area (mm2) | Volume (mm3) |
|---|---|---|---|---|
| PZT cell #4 | ~50 | 17 | 1600 | 1195 |
| e.p.i. | 52 (×1.04) | 130 (×7.64) | 32 (×0.02) | 51.2 (×0.04) |

The comparison shows that, with a ΔT substantially similar, a device according to an embodiment can produce a total charge more than 7 times higher with respect to the reference PZT cell, with a dramatic reduction in surface and volume. (see numerical values in parentheses)

Figure 15:
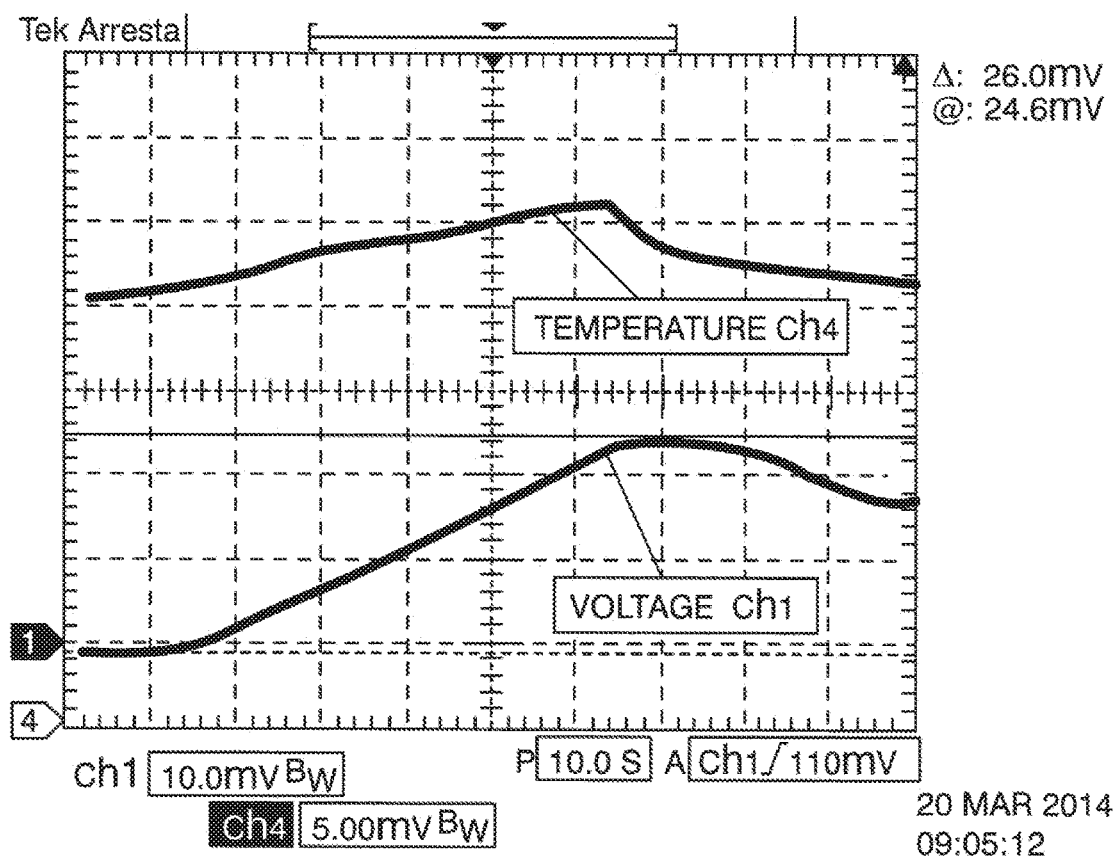
FIG. 15 shows a test of four MLCCs cells at a slow rate employing a temperature scale of 1 mV/1° C. and a 100 μF load capacitor according to an embodiment of the present invention.

For the slow T variation rate, a device according to an embodiment was put near a small heater; the resulting ΔT was about 6° C. during a time interval of 55 s. The measured voltage and temperature are depicted in FIG. 15. The results are: peak voltage $V_{peak}$=26 mV; therefore, the total accumulated charge is Q=26 mV·100 μF=2, 6 μC with ΔT=6° C. Also with the slow T variation rate testing condition, even with a smaller ΔT, the device according the embodiment can show a better performance compared with the reference PZT cell, as shown in Table 9 (see numerical values in parentheses):

|  | ΔT (° C.) | Total charge (μC) | Surface area (mm2) | Volume (mm3) |
|---|---|---|---|---|
| PZT cell #4 | ~8 | 1.3 | 1600 | 1192 |
| e.p.i. | 6 (×0.75) | 2.6 (×2) | 32 (×0.02) | 51.2 (×0.04) |

Figure 16:
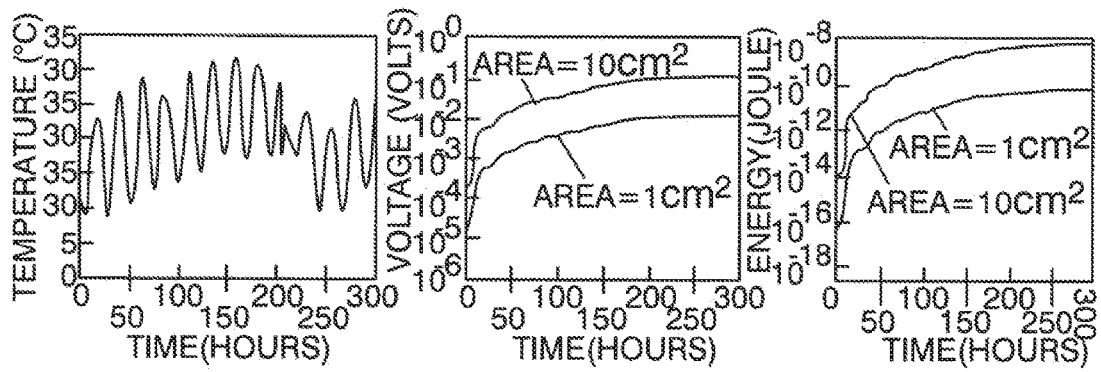
FIG. 16 shows PVDF cells tested with temperature cycles in three different environmental conditions in an Example 3.
Figure 16:
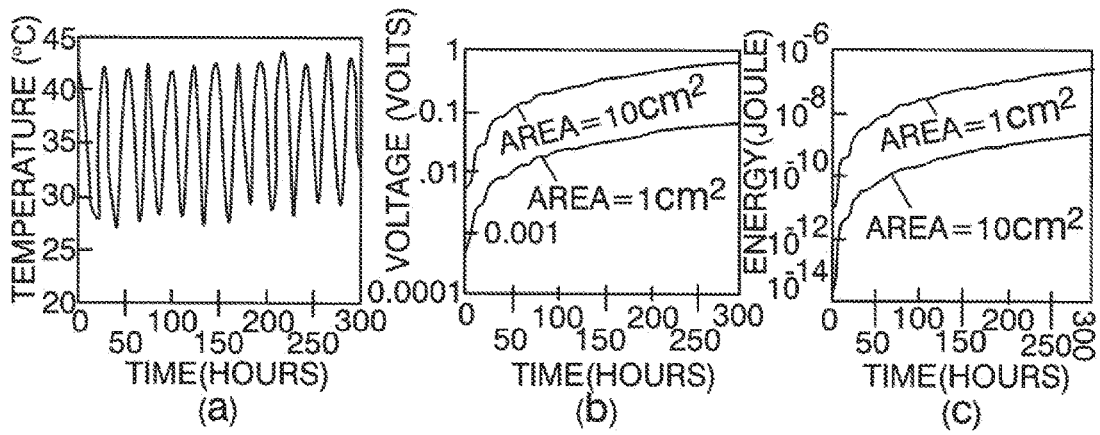
Figure 16:
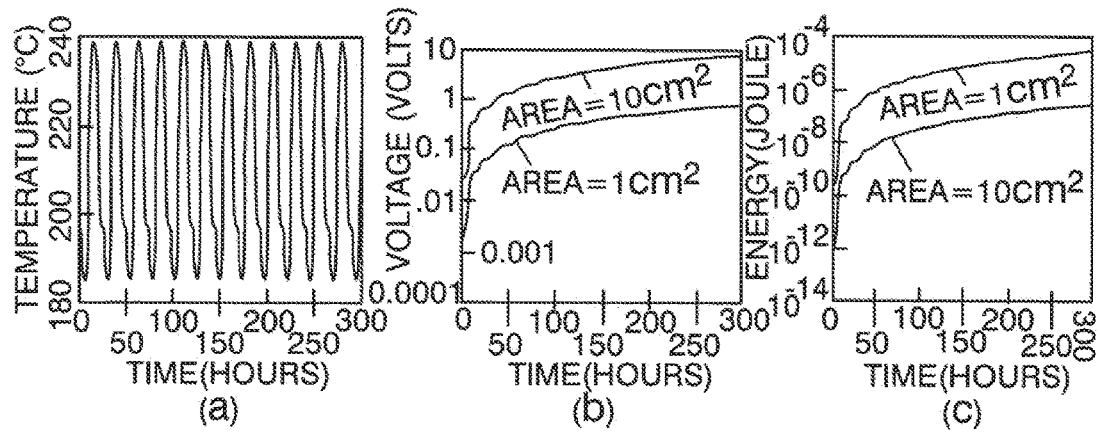
Figure 17:
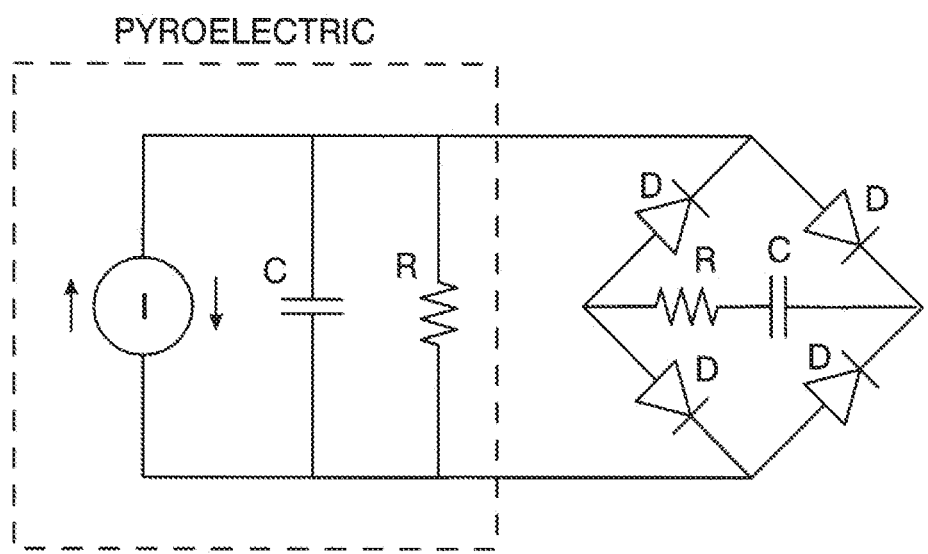
FIG. 17 shows a pyroelectric cell current generator with full wave rectifier bridge.

The performance of a four-capacitor cell according to an embodiment was also compared with a more recent experiment, made simulating three different environmental conditions. As a third Example 3 it is referred to the paper by A. K. Batra, A. Bandyopadhyay, A. K. Chilvery, M. Thomas: "Modeling and simulation for PVDF-based Pyroelectric Energy Harvester" (in: Energy Science and Technology, Vol. 5, N.2, 2013, pp 1-7). In this published paper cells made of polyvinylidene fluoride (PVDF) were subjected to 300 hours cycles under different conditions to simulate the environment of Huntsville (Ala., USA), Saudi Arabia and Mars. To collect energy in both increasing and diminishing temperature intervals, a rectifying bridge with a store capacitor (1 μF) was provided to accumulate the electrical charge, according to the circuit shown in FIG. 17, which describes a full-wave bridge rectifier circuit with four diodes. In FIG. 16 the values for environmental temperature, generated voltage and collected energy for the PVDF cells are presented.

In Table 10 the data about the cumulated charge over 300 hours are summarized from the above scientific literature as the predicted results (voltage and energy) obtained numerically for three locations:

|  | Area = 1 cm2 | | Area = 10 cm2 | |
|---|---|---|---|---|
| Location | Voltage (V) | Energy (J) | Voltage (V) | Energy (J) |
| Huntsville | 0.013 | 8.34 × 10−11 | 0.13 | 8.34 × 10−9 |
| Saudi Arabia | 0.07 | 2.94 × 10−9 | 0.7 | 2.45 × 10−7 |
| MARS | 0.77 | 2.95 × 10−7 | 7.7 | 2.95 × 10−5 |

For the largest area cells (10 cm²), the resulting accumulated charges after 300 hours are: Huntsville 0.13 μC; Saudi Arabia 0.7 μC; MARS 7.7 μC. These values can be easily compared with the results from the previous device according to an embodiment of the present invention, which turns out to be by far better in performances. In the tests, standard available chip capacitors (MLCC) were used: surprisingly and unexpectedly, they still exhibit good pyroelectric properties, even after several thousand cycles. However, even better results can be produced.

The pyroelectric cells are well known devices, but the use of standard MLCC capacitors, which have been subjected to a suitable poling process, represents a novelty in the application of temperature variation measurements. For example, embodiments of the present invention show that poled BaTiO3 based MLCCs turn out to be a cheap, high performance, compact, modular and robust component for a pyroelectric cell. Method embodiments of the present invention allow very high sensitivities at detecting temperature variations. Very high capability to extract energy from the environmental temperature fluctuations, low cost and high flexibility and integrability in more complex equipment can further be obtained. According to respective embodiments of the present invention, the poling of the MLCCs can be performed either before assembling the MLCCs in a pyroelectric cell, or after the device manufacturing, provided that the cell is equipped with a suitable poling circuit.

Since the temperature variations applied during the tests can have a transitory character, the current generated by the pyroelectric effect can be transitory as well. Average values can, however, be provided, to give an idea of the performances of the device; peak values could be obtained as difference quotient for a small time interval and the total accumulated charge can be evaluated from the voltage across the capacitor and the effective capacitance of the device. For a single MLCC with an area of 8 mm² and an effective capacitance after poling of about 12.7 micro-Farad, with a slow temperature variation of about 0.08° C./sec, an average current value of 57 nano-Ampere can be obtained, with a total charge of 2.54 micro-Coulomb, which corresponds to a voltage value across the capacitor of 0.2 Volt measured after 44 seconds. The total energy is about 0.254 micro-Joule. In the case of a faster temperature variation of 0.68° C./sec, the same device exhibited an average current of 0.771 micro-Ampere, with a total accumulated charge of 24.7 micro-Coulomb and a resulting voltage of 1.95 Volt, measured after 32 seconds. The total energy is about 24.14 micro-Joule.

Surprisingly and unexpectedly, m the poling process is performed more preferably at low temperatures. Poling the device at −18° C. for two hours, using an electric field in the range 50 kilo-Volts/cm to 350 kilo-Volts/cm, a leakage current lower than 20 nano-Amperes can be observed, which points out to a very low damage in the device. Tests performed subsequently, at room temperature, with a temperature variation of about 1.1° C./sec have provided average currents of about 1.6 micro-Amperes with a total accumulated charge of 32 micro-Coulomb and a resulting voltage of about 2.5 Volt, measured after 20 seconds. The total energy is about 39.68 micro-Joule.

Therefore, peak currents of the order of several micro-Amperes for a temperature variation of 1° C./sec can be obtained with a single, well poled device. In the same conditions, average current value in excess of 1 micro-Ampere can be expected. In general, the reported values for the electrical parameters, particularly the stored energy, have been obtained using MLCC devices which did not exhibit initially any previous stored charge. The initial voltage across them was therefore zero.

According to a further embodiment, energy even higher can be obtained if the capacitor is electrically pre-charged:

if the devices undergo the same temperature variations applied above, the net collected energy (after subtracting the pre-charging stored energy) turns out to be higher, surprisingly and unexpectedly. This points out that the efficiency in the energy harvesting may also depend on the electrical setup.

To pre-charge the pyroelectric generator a common voltage generator can be used; also an energy storage element (a battery, a capacitor or the like) can provide the pre-charging of the pyroelectric generator.

In a harvesting device, the pyroelectric generator can be connected to an energy storage device, to transfer energy. Various electronic elements like diodes, resistors and the like can be combined in a suitable circuit to manage and transfer efficiently the collected energy to the storage device. Also sophisticated interface circuits, comprising microinductors, oscillators, charge pumps, logical ports and the like can be used for an optimum energy transfer.

In a temperature variation measurement device, the signal coming from the pyroelectric generator, either voltage or current, can be read with a common testing equipment (oscilloscope, multimeter, microamperometer and the like). A calibration procedure is performed to convert the electrical signal coming from the pyroelectric element in a temperature variation value. In the calibration, fixed temperature levels and variations can be used to get a response curve of the device. Possibly, an amplification of the signal can be used if necessary.

Generally, for many capacitors in parallel, the expected values of current, accumulated charge and stored energy are proportional to the number of the devices.

According to a further embodiment a pyroelectric device advantageously provides temperature variations detection with a greater output response than conventional single-element temperature variations detectors.

Although detailed embodiments have been described, these only serve to provide a better understanding of the invention defined by the independent claims, and are not to be seen as limiting.

The invention claimed is:

1. A poled pyroelectric device, comprising:
   a plurality of layers of a polar dielectric material having a pyroelectric coefficient, p, wherein each layer exhibits pyroelectric properties, and wherein said polar dielectric material is an undoped or doped $BaTiO_3$ (barium titanate);
   a plurality of conductive electrodes layers, wherein each conductive electrodes layer is substantially in contact with at least a portion of one surface of a respective at least one of said plurality of layers of polar dielectric material,
   wherein the conductive electrodes layers are arranged vertically one on top of another, and separated by polar dielectric material layers in-between, and the conductive electrodes layers are alternately electrically interconnected together in a parallel configuration as to form a series of capacitors comprised of said plurality of layers of polar dielectric material and plurality of conductive electrodes layers,
   wherein odd conductive electrodes layers are electrically connected at one end and even conductive electrodes layers are electrically connected at an opposite end so that both external terminations form electrical contacts of capacitors plates, wherein the pyroelectric device is poled by a poling process such that ferroelectric domains of the polar dielectric material are aligned with their dipoles in the same direction, the poling process consisting in:
   heating the device at a temperature in the range 120° C. to 150° C., applying an electric field in the range 10 kilovolt/cm to 60 kilovolt/cm for about 2 hours, and then allowing the device to freely cool down to room temperature; or
   cooling down the device to −18° C., then exposing the device at −18° C. for two hours to an electric field in the range 50 kilovolt/cm to 350 kilovolt/cm, and allowing subsequently the device to return freely to room temperature.

2. The pyroelectric device of claim 1, wherein the plurality of layers of the polar dielectric material and the plurality of conductive electrodes are stacked vertically one on top of another.

3. The pyroelectric device of claim 1, wherein the series of capacitors comprises at least two or three capacitors.

4. The pyroelectric device of claim 1, wherein the series of capacitors comprises more than ten capacitors.

5. The pyroelectric device of claim 1, wherein the plurality of layers of the polar dielectric material and the plurality of conductive electrodes stacked vertically one on top of another are integrated in an MLCC capacitor (Multi-Layer Ceramic Capacitor) of a size smaller than 5 mm or smaller than 1 mm.

6. The pyroelectric device of claim 1, wherein at least one of said electrodes is a precious-metal-electrode (PME), comprising platinum, gold, silver-palladium, or, alternatively, a conductive oxide, iridium oxide, nickel or, a base-metal-electrode (BME).

7. The pyroelectric device of claim 1, wherein the pyroelectric device comprises at least a top electrode, a layer of barium titanate, a first interim electrode, another layer of barium titanate, a second interim electrode, a third layer of barium titanate, and a bottom electrode resulting in at least three capacitors electrically connected in parallel.

8. The pyroelectric device of claim 1, wherein said pyroelectric device has an output response resulting from exposure to temperature variations.

9. The pyroelectric device of claim 8, wherein the output response is an output current proportional to the area A of the series of capacitors, or a pyroelectric current, I, monitored for example as a pyroelectric voltage drop, V, across an external resistor, or as a power, or as a signal obtained processing the output response of the pyroelectric device through a suitable electronic device, being an operational amplifier.

10. The pyroelectric device of claim 1, wherein said pyroelectric device is used in either a contact or in a non-contact temperature variation measurement device.

11. Use of the pyroelectric device of claim 1 for energy harvesting.

12. A temperature variation measurement device comprising a pyroelectric device according to claim 1.

13. A method of measuring a temperature variation comprising the step of measuring the output response of a pyroelectric device according to claim 1.

14. The pyroelectric device of claim 1, wherein the number of the layers of a polar dielectric material is between 100 and 500.

15. The pyroelectric device of claim 14, wherein an active area of a single layer of a polar dielectric material is between 1 and 10 $mm^2$.

16. The pyroelectric device of claim 14, wherein a total effective area for the pyroelectric device is between 500 and 3000 mm².

17. The pyroelectric device of claim 1, wherein the capacitors are electrically pre-charged.

* * * * *